United States Patent
Ku et al.

(10) Patent No.: US 9,658,249 B2
(45) Date of Patent: May 23, 2017

(54) PROBE CARD CAPABLE OF TRANSMITTING HIGH-FREQUENCY SIGNALS

(71) Applicant: MPI CORPORATION, Hsinchu County (TW)

(72) Inventors: Wei-Cheng Ku, Hsinchu (TW); Jun-Liang Lai, Hsinchu (TW)

(73) Assignee: MPI CORPORATION, Zhubei, Hsinchu County (TW)

( * ) Notice: Subject to any disclaimer, the term of this patent is extended or adjusted under 35 U.S.C. 154(b) by 0 days.

(21) Appl. No.: 14/140,294

(22) Filed: Dec. 24, 2013

(65) Prior Publication Data

US 2014/0176177 A1 Jun. 26, 2014

(30) Foreign Application Priority Data

Dec. 26, 2012 (TW) .............................. 101150149 A (51) Int. Cl.
*G01R 1/067* (2006.01)

(52) U.S. Cl.
CPC ................................ *G01R 1/06772* (2013.01)

(58) Field of Classification Search
CPC .................... G01R 1/07342; G01R 1/06772
USPC ................................................. 324/755, 756
See application file for complete search history.

(56) References Cited

U.S. PATENT DOCUMENTS

| | | | |
|---|---|---|---|
| 6,218,910 B1* | 4/2001 | Miller | 333/33 |
| 7,388,424 B2* | 6/2008 | Miller | 327/551 |
| 2004/0140824 A1* | 7/2004 | Ji et al. | 324/754 |
| 2007/0285085 A1* | 12/2007 | Strid et al. | 324/149 |
| 2008/0164900 A1* | 7/2008 | Ku et al. | 324/762 |
| 2010/0117673 A1* | 5/2010 | Lee et al. | 324/761 |
| 2010/0127721 A1* | 5/2010 | Kuo | 324/754 |

FOREIGN PATENT DOCUMENTS

CN 102736007 A 10/2012

* cited by examiner

*Primary Examiner* — Son Le
*Assistant Examiner* — Akm Zakaria
(74) *Attorney, Agent, or Firm* — Ming Chew; Sinorica, LLC (57) ABSTRACT

A probe card which is capable of transmitting high-frequency signals provided by a DUT, and the DUT includes an output pin group and an input pin group for sending and receiving the high-frequency signals respectively. The probe card includes a first signal pin group, a second signal pin group, and a multiband circuit. The first signal pin group is made of a conductive material, and is used to contact the output pin group; the second signal pin group is made of a conductive material too, and is used to contact the input pin group; the multiband circuit is electrically connected to the first signal pin group and the second signal pin group to allow signals within a first bandwidth and a second bandwidth to pass therethrough.

1 Claim, 8 Drawing Sheets

PROBE CARD CAPABLE OF TRANSMITTING HIGH-FREQUENCY SIGNALS

The current application claims a foreign priority to the application of Taiwan 101150149 filed on Dec. 26, 2012.

BACKGROUND OF THE INVENTION

1. Technical Field

The present invention relates generally to probe card, and more particularly to a probe card which is capable of transmitting high-frequency signals.

2. Description of Related Art

Probe cards are applied as transmission interfaces between a tester and a device under test (DUT) to transmit test signals and power signals, which is a widely used method for testing if every electronic component of the DUT is electrically connected correctly.

However, with the advancement of digital technology, the operating speed and the signal throughput of electronic devices are increasing, which make the frequencies of test signals generated by processors of the tester insufficient to satisfy the demand to test such electronic devices. Therefore, in order to solve this problem, the DUT may be utilized to generate high-frequency signals which meet test requirement, and those signals are then transmitted back to the DUT again via probe cards.

Figure 1:
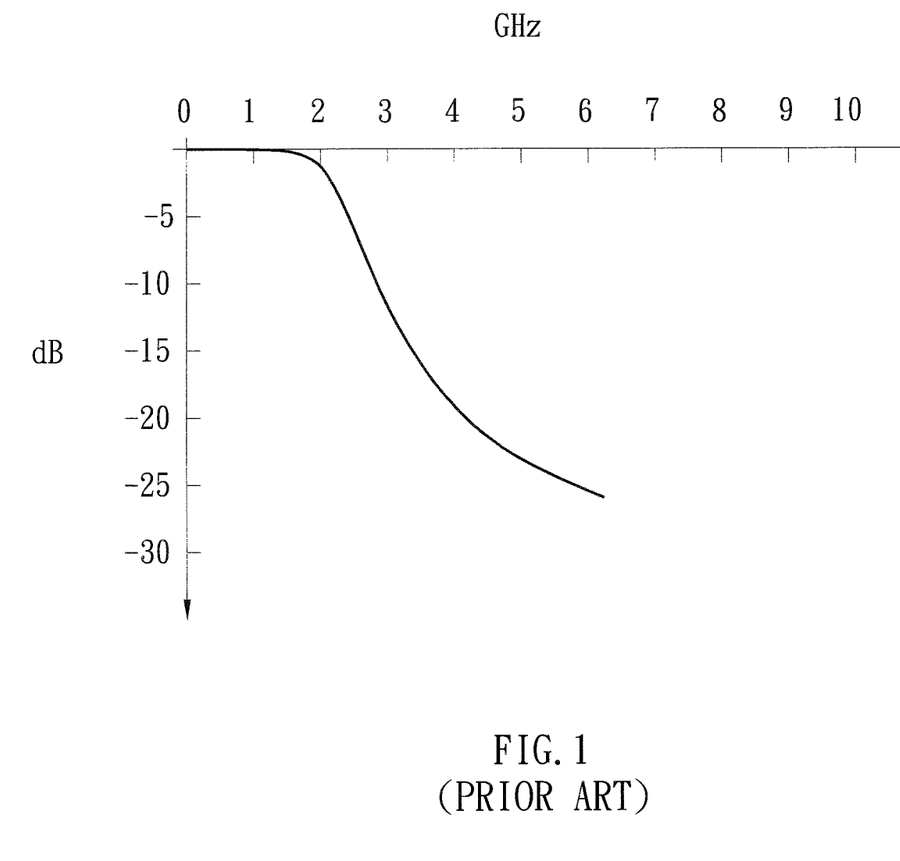
FIG. 1 is a diagram showing the attenuation of signals with different frequencies after the signals passing through the conventional probe card.
Figure 2:
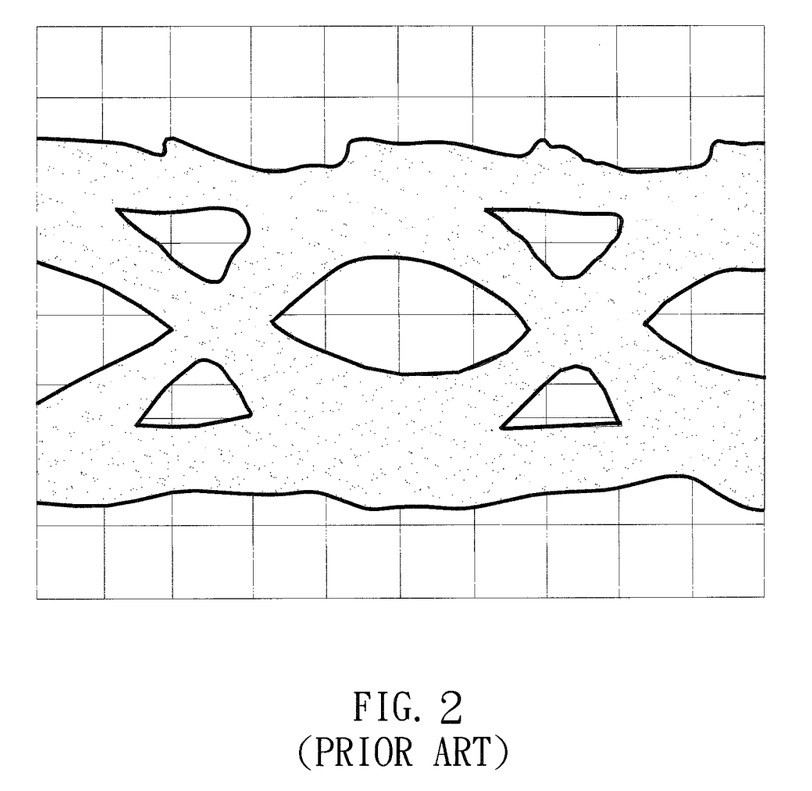
FIG. 2 is an eye diagram of signals passing through the conventional probe card.

Nevertheless, on a conventional probe card, there would be a slight inductance between a wire and a pin while the probe card is transmitting signals, and due to electrical field effects, resistance would increase with higher frequencies of signals transmitted. As a result, the circuit structure of the conventional probe card becomes a low-pass circuit. As shown in FIG. 1 and FIG. 2, the low-pass circuit obstructs high-frequency signals from passing therethrough, and therefore test signals may be not easily recognized by the DUT, which may lead to misjudgment during test procedures. To improve the aforementioned situation, pins with lower inductance would be needed, or the circuit structure would have to be re-designed. These methods would either cost more or increase the complexity of circuits, which is detrimental for maintenance and development in the future.

BRIEF SUMMARY OF THE INVENTION

In view of the above, the primary objective of the present invention is to provide a probe card which is capable of transmitting high-frequency signals effectively.

The present invention provides a probe card capable of transmitting high-frequency signals provided by a device under test (DUT), wherein the DUT includes an output pin group and an input pin group for sending and receiving the high-frequency signals respectively. The probe card includes a first signal pin group, a second signal pin group, and a multiband circuit, wherein the first signal pin group is made of a conductive material, and is used to contact the output pin group of the DUT; the second signal pin group is made of a conductive material, and is used to contact the input pin group of the DUT; the multiband circuit is electrically connected to the first signal pin group and the second signal pin group to allow signals within a first bandwidth and a second bandwidth to pass therethrough, and signals beyond the first and the second bandwidths are attenuated or filtered out. More specifically, a lowest frequency of the first bandwidth is 0 Hz, and a highest frequency of the first bandwidth is lower than a lowest frequency of the second band; the high-frequency signals for transmission are within the second bandwidth.

Whereby, once the output pin group of the DUT sends the high-frequency signals, the high-frequency signals are transmitted to the multiband circuit through the first signal pin group, and then transmitted to the input pin group of the DUT through the second signal pin group.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 3:
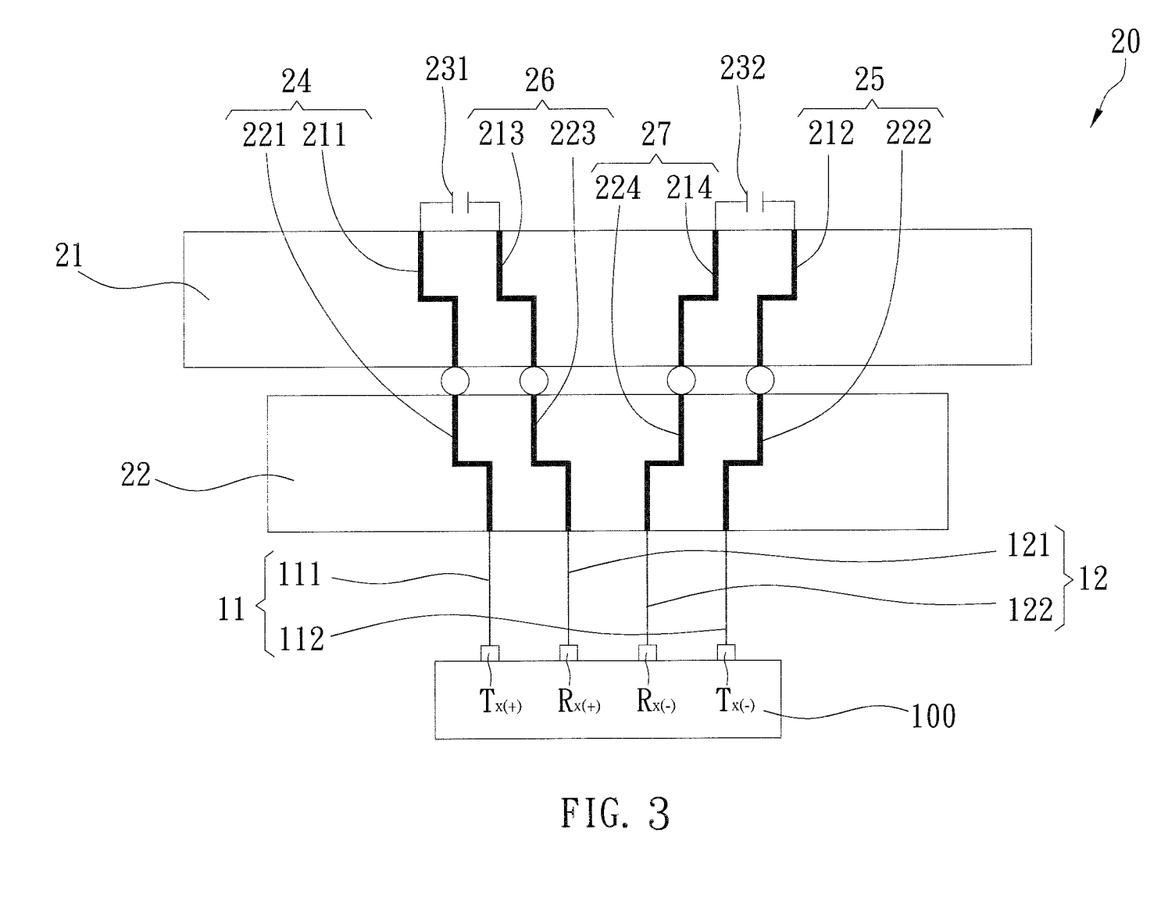
FIG. 3 is a sketch diagram of a first embodiment of the present invention.

As shown in FIG. 3, while a device under test (DUT, such as a processor) 100 is being tested with high signal throughput, the DUT 100 provides high-frequency signals for test purpose, and a probe card of the first preferred embodiment of the present invention is used to transmit those high-frequency signals. For example, if the signal throughput for test is 10 G bps in the present preferred embodiment, the high-frequency signals transmitted would be 5 GHz, which is a half of the signal throughput. The DUT 100 has an output pin group and an input pin group, wherein the output pin group is used for sending the high-frequency signals, and the input pin group is used for receiving the high-frequency signals. The output pin group includes a positive output pin Tx(+) and a negative output pin Tx(−), which send positive and negative signals respectively; similarly, the input pin group includes a positive input pin Rx(+) and a negative input pin Rx(−), which receive positive and negative signals respectively. The probe card of the first preferred embodiment of the present invention includes a first signal pin group 11, a second signal pin group 12, and a multiband circuit 20.

The first signal pin group 11 includes a first positive signal pin 111 and a first negative signal pin 112, which are both made of conductive materials, and are used to contact the positive output pin Tx(+) and the negative output pin Tx(−) respectively. Similarly, the second signal pin group 12 includes a second positive signal pin 121 and a second negative signal pin 122, which are both made of conductive materials too, and are used to contact the positive input pin Rx(+) and the negative input pin Rx(−) respectively as well.

The multiband circuit 20 is electrically connected to the first signal pin group 11 and the second signal pin group 12. The major difference between the present invention and the prior art is at the design of the multiband circuit 20. Since the resistance of the conventional probe card increases with higher frequencies of the signals transmitted, its circuit becomes a low-pass filtering circuit. In other words, such circuit only allows the signals lower than a specific frequency to pass therethrough, and the signals higher than the specific frequency would be greatly attenuated or filtered out. On the contrary, when the multiband circuit 20 is electrically connected to the first signal pin group 11 and the second signal pin group 12, its circuit structure could allow the signals within a first bandwidth and a second bandwidth to pass therethrough. More specifically, a highest frequency of the first bandwidth is lower than a lowest frequency of the second band. As to the signals beyond the first and the second bandwidths described here, they would be greatly attenuated or filtered out. In an embodiment, the lowest frequency of the first bandwidth is 0 Hz, which allows DC signals for power supplying to pass therethrough. The frequencies of the high-frequency signals are within the second bandwidth, and are preferably to be at middle of the second bandwidth to make sure that the high-frequency signals could pass therethrough successfully.

Figure 4:
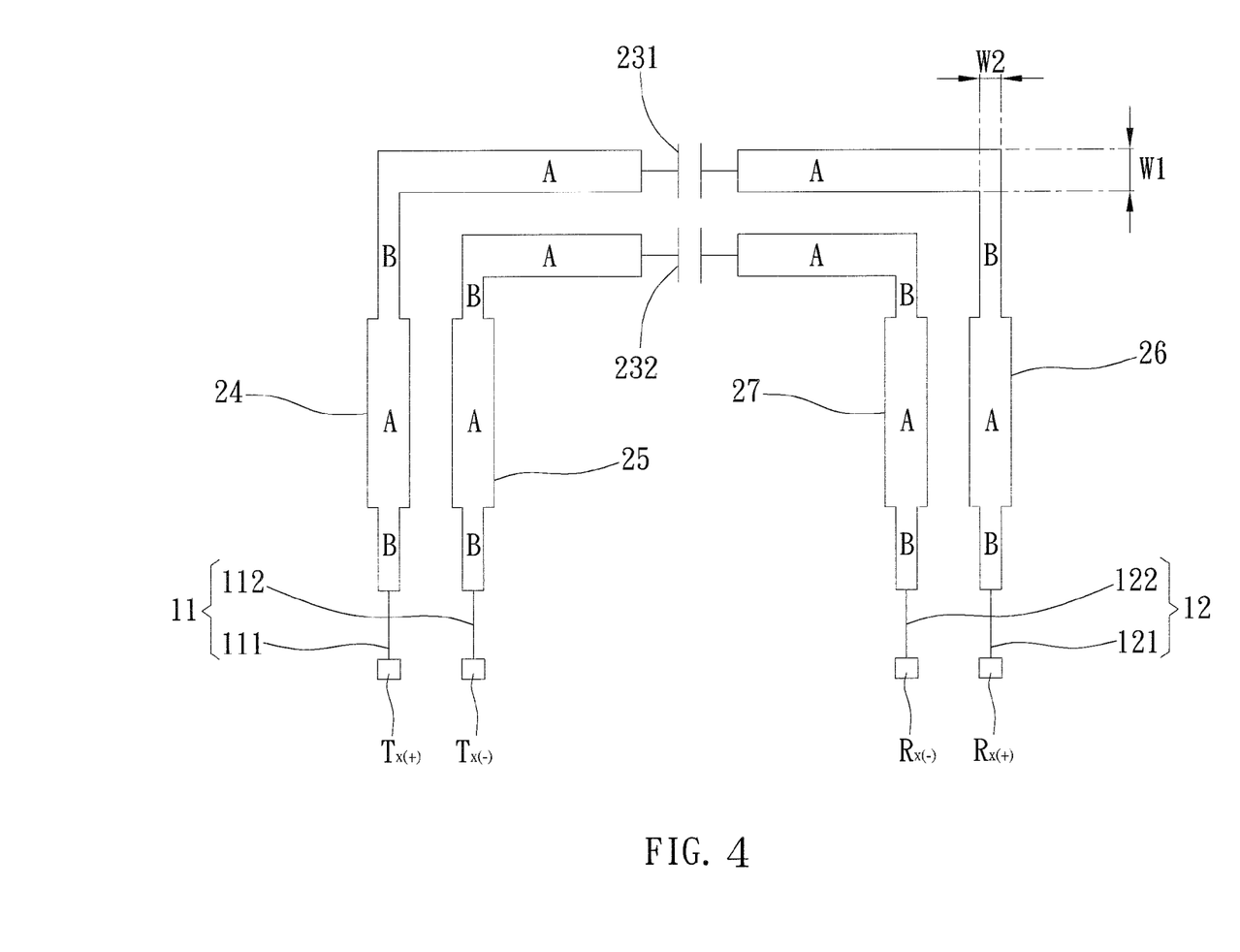
FIG. 4 is a circuit of the first embodiment of the present invention.

In other to achieve the aforementioned function of the multiband circuit 20, the multiband circuit 20 includes a circuit substrate 21, a carrier substrate 22, and two capacitors 231, 232 in the present preferred embodiment. There is a circuit layout on the circuit substrate 21 (not shown) to be connected to a tester (not shown). The circuit substrate 21 has a plurality of wires 211~214 therein. The carrier substrate 22 has a plurality of wires 221~224 therein too. A side of the carrier substrate 22 is electrically connected to the circuit substrate 21, while an opposite side thereof touches the first signal pin group 11 and the second signal pin group 12. Therefore, an end of each wire 221~224 is electrically connected to one of the wires 211~214 respectively, and the other end thereof is electrically connected to one of the signal pins 111~112, 121~122 respectively. As shown in FIG. 4, those wires 211~212, 221~222 which are electrically connected to the first signal pin group 11 form a first signal wire group, which includes a first positive signal wire 24 and a first negative signal wire 25, wherein the first positive signal wire 24 includes the wires 211, 221 which are electrically connected to the first positive signal pin 111, and the first negative signal wire 25 includes the wires 212, 222 which are electrically connected to the first negative signal pin 112. Those wires 213~214, 223~224 electrically connected to the second signal pin group 12 form a second signal wire group, which includes a second positive signal wire 26 and a second negative signal wire 27, wherein the second positive signal wire 26 includes the wires 213, 223 which are electrically connected to the second positive signal pin 121, and the second negative signal wire 27 includes the wires 214, 224 which are electrically connected to the second negative signal pin 122. In addition, those wires 24~27 all have a first wire segment A and a second wire segment B, which have the following relationship:

$$W1 \neq W2; \text{ and}$$

$$W2 \leq 0.9 W1;$$

where W1 is a diameter of the first wire segment A, and W2 is a diameter of the second wire segment B.

By modifying the diameters of those wires 24~27, equivalent capacitance and equivalent inductance of each wire segment A or B could be adjusted. Besides, diameters of the wires 211~214 are different from diameters of the wires 221~224 in the preferred embodiment. In practice, the wires 211~214 and 221~224 could all have segments with different diameters. Moreover, in other embodiments, there could be only either the wires 211~214 or the wires 221~224 to have segments with different diameters.

In the present preferred embodiment, the two capacitors 231, 232 are stand-alone components (in other words, they are physical capacitors) provided on the circuit substrate 21, and are defined as a first capacitor 231 and a second capacitor 232. Two ends of the first capacitor 231 are connected to the first positive signal wire 24 (wire 211) and the second positive signal wire 26 (wire 213) respectively, and two ends of the second capacitor 232 are connected to the first negative signal wire 25 (wire 212) and the second negative signal wire 27 (wire 214) respectively.

Figure 5:
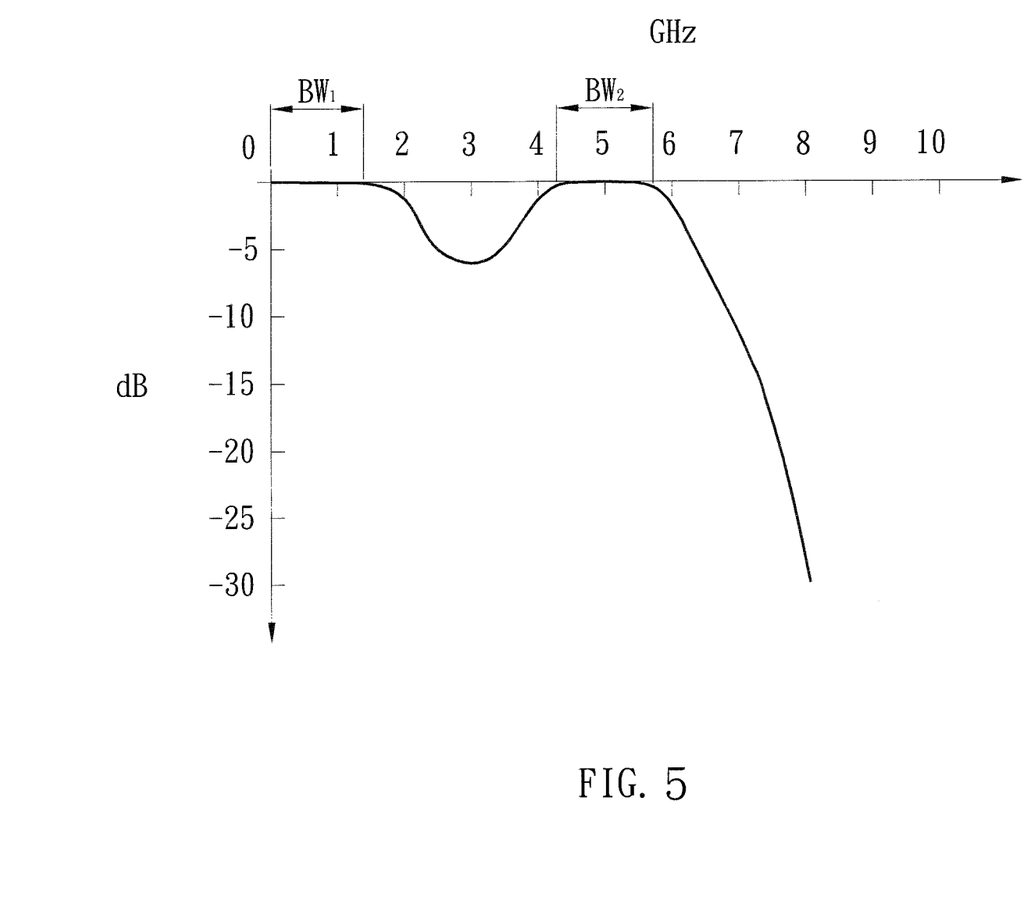
FIG. 5 is a diagram showing the attenuation of signals with different frequencies after the signals passing through the probe card of the first preferred embodiment of the present invention.
Figure 6:
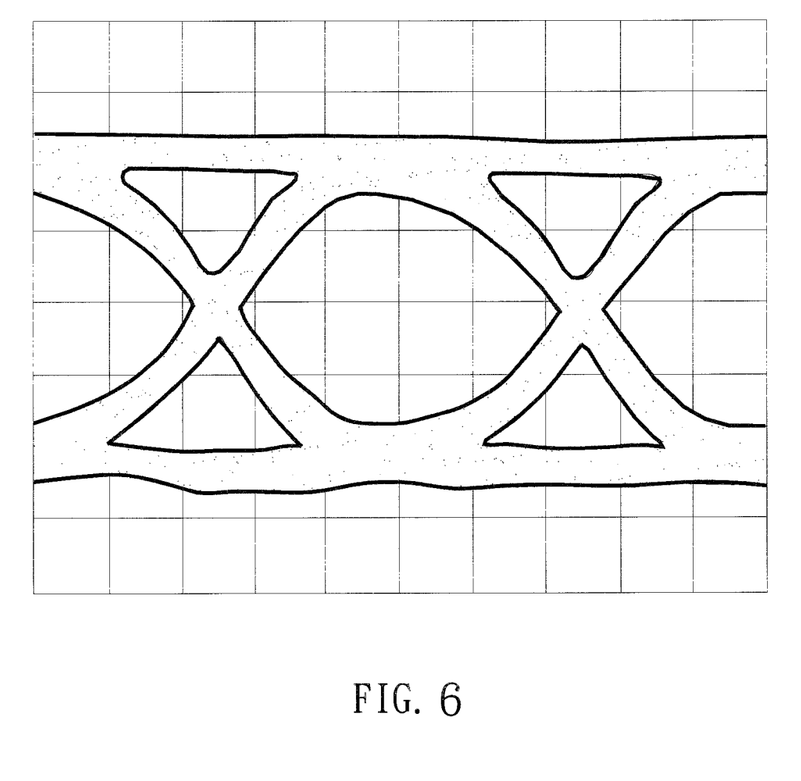
FIG. 6 is an eye diagram of signals passing through the probe card of the first preferred embodiment of the present invention.

In this way, the signal pins 111~112, 121~122, an equivalent capacitor of the wire segments A, B, and an equivalent inductor thereof altogether form an equivalent circuit. With the equivalent circuit and the capacitors 231, 232, the aforementioned function of the multiband circuit 20 is achieved. Furthermore, as shown in FIG. 5, the multiband circuit 20 could allow signals within the first bandwidth $BW_1$ (the lowest frequency thereof is 0 Hz) and the second bandwidth $BW_2$ (the frequency of a middle thereof is about 5 GHz) to pass therethrough; signals which are beyond the two bands $BW_1$, $BW_2$ are attenuated or filtered out. As a result, as shown in FIG. 6, after the high-frequency signals passing the probe card, peaks and troughs thereof could still be easily recognized, which could avoid misjudgment during test procedures.

Figure 7:
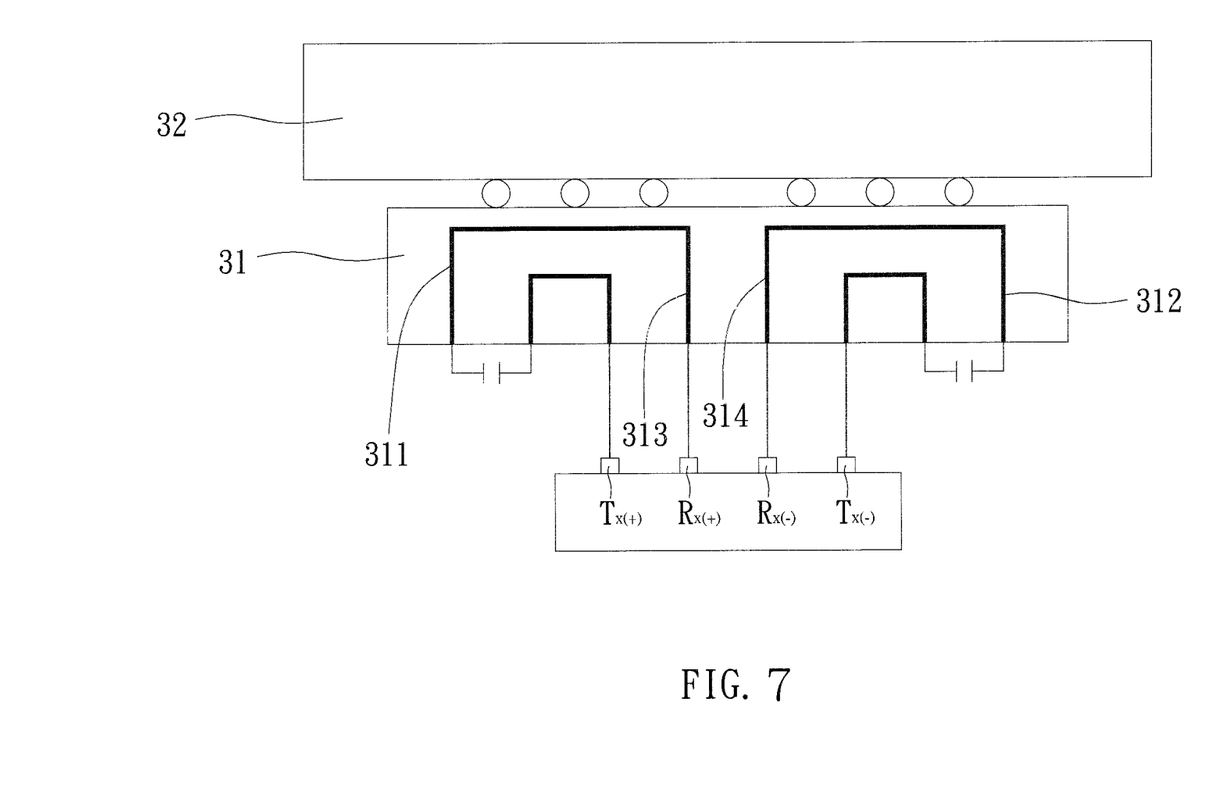
FIG. 7 is a sketch diagram of a second embodiment of the present invention.
Figure 8:
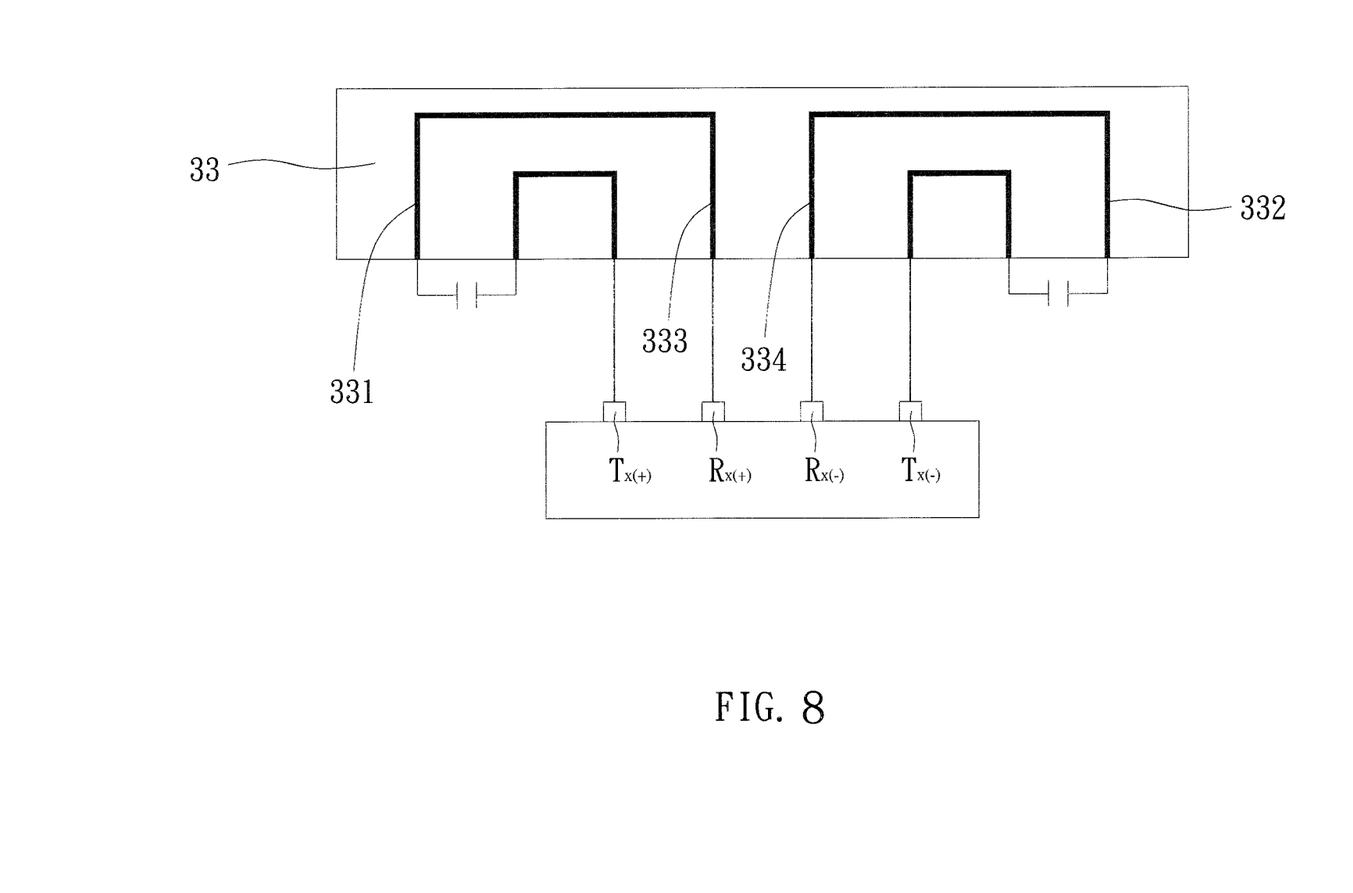
FIG. 8 is a sketch diagram of a third embodiment of the present invention.

In addition to the aforementioned design, the signal wires 311~314 are embedded in the carrier substrate 31 only but not in the circuit substrate 32 in another embodiment, as shown in FIG. 7. Or as shown in FIG. 8, depending on the distances between each pin of the DUT 100, there could be merely the circuit substrate 33 applied with the signal wires 331~334 provided therein in other embodiments. Besides, although the multiband circuit 20 adopts physical capacitors 231, 232 in the preferred embodiment, embedded capacitors integrated with circuit substrates or carrier substrates could provide the same function as well. Furthermore, though the wire segments A have the same diameters while the wire segments B have other same diameters in the preferred embodiment to adjust the equivalent capacitance and the equivalent inductance, there could be more than three different diameters along each signal wire 24~27 in practice. Needless to say, though the multiband circuit 20 of the preferred embodiment allows signals within two bandwidths to pass therethrough, multiband circuits in other embodiments could allow signals within more than three bandwidths to pass therethrough by modifying designs as needed. It must be pointed out that the embodiments described above are only some preferred embodiments of the present invention. All equivalent structures and methods which employ the concepts disclosed in this specification and the appended claims should fall within the scope of the present invention.

What is claimed is:

1. A probe card capable of transmitting high-frequency signals provided by a device under test (DUT), wherein the DUT includes an output pin group and an input pin group for sending and receiving the high-frequency signals respectively, the probe card comprising:
- a first signal pin group, which is made of a conductive material, for contacting the output pin group of the DUT;
- a second signal pin group, which is made of a conductive material, for contacting the input pin group of the DUT; and
- a multiband circuit, which is electrically connected to the first signal pin group and the second signal pin group to allow signals within a first bandwidth and a second bandwidth to pass therethrough, and signals beyond the first and the second bandwidths are attenuated or filtered out; wherein, a lowest frequency of the first bandwidth is 0 Hz, and a highest frequency of the first bandwidth is lower than a lowest frequency of the second band; the high-frequency signals for transmission are within the second bandwidth;
- whereby, once the output pin group of the DUT sends the high-frequency signals, the high-frequency signals are transmitted to the multiband circuit through the first signal pin group, and then transmitted to the input pin group of the DUT through the second signal pin group;
- wherein the multiband circuit includes at least a capacitor, a first signal wire group, and a second signal wire group; the first signal wire group and the second signal wire group are respectively connected to two ends of the capacitor; the first signal wire group and the second signal wire group are made of conductive materials, and are electrically connected to the first signal pin group and the second signal pin group respectively; the first signal wire group and the second signal wire group each has at least a wire respectively, and each wire has a first wire segment and a second wire segment which have the following relationship:

$W1 \neq W2;$ $W2 \leq 0.9W1;$ where W1 is a diameter of the first wire segment, and W2 is a diameter of the second wire segment;

wherein the output pin group of the DUT includes a positive output pin and a negative output pin, and the input pin group of the DUT includes a positive input pin and a negative input pin; the first signal pin group includes a first positive signal pin and a first negative signal pin for contacting the positive output pin and the negative output pin respectively; the second signal pin group includes a second positive signal pin and a second negative signal pin for contacting the positive input pin and the negative input pin respectively, a number of the at least one capacitor of the multiband circuit is two, which are defined as a first capacitor and a second capacitor; a number of the at least one wire of the first signal wire group is two, which are defined as a first positive signal wire and a first negative signal wire; two ends of the first positive signal wire are connected to the first capacitor and the first positive signal pin respectively; two ends of the first negative wire are connected to the second capacitor and the first negative signal pin respectively; a number of the at least one wire of the second signal wire group is two, and the two wires are defined as a second positive signal wire and a second negative signal wire; two ends of the second positive signal wire are connected to the first capacitor and the second positive signal pin respectively; two ends of the second negative wire is connected to the second capacitor and the second negative signal pin respectively;

wherein the multiband circuit further includes a circuit substrate and a carrier substrate electrically connected to each other, wherein a circuit layout is provided on the circuit substrate; either the carrier substrate or the circuit substrate is connected to the first signal pin group and the second signal pin group; the first signal wire group and the second signal wire group are either completely embedded in either the circuit substrate or the carrier substrate, or partially embedded in the circuit substrate and partially embedded in the carrier substrate;

wherein the capacitor is either an embedded capacitor embedded in either the circuit substrate or the carrier substrate, or a stand-alone component provided on either the circuit substrate or the carrier substrate.

* * * * *